(12) United States Patent
Matsubara et al.

(10) Patent No.: US 9,379,716 B2
(45) Date of Patent: Jun. 28, 2016

(54) ELECTRONIC CIRCUIT, METHOD OF CONTROLLING ELECTRONIC CIRCUIT, AND ELECTRONIC APPARATUS

(71) Applicant: Sony Corporation, Tokyo (JP)

(72) Inventors: Takeshi Matsubara, Kanagawa (JP); Masahisa Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/626,202

(22) Filed: Feb. 19, 2015

(65) Prior Publication Data
US 2015/0256186 A1  Sep. 10, 2015

(30) Foreign Application Priority Data
Mar. 7, 2014  (JP) .................................. 2014-044472

(51) Int. Cl.
H03L 7/06 (2006.01)
H03L 7/08 (2006.01)
G04F 10/00 (2006.01)

(52) U.S. Cl.
CPC ................ *H03L 7/08* (2013.01); *G04F 10/005* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 2005/0237848 A1* | 10/2005 | Takahashi | .............. | G11C 5/145 365/232 |
| 2010/0301921 A1* | 12/2010 | Isohata | ................ | H03K 17/166 327/427 |
| 2011/0051536 A1* | 3/2011 | Park | .......................... | G11C 7/22 365/194 |
| 2013/0094673 A1* | 4/2013 | Moon | ...................... | H03F 1/327 381/120 |
| 2013/0257502 A1* | 10/2013 | Dong | .................... | H03K 17/284 327/288 |
| 2014/0340121 A1* | 11/2014 | Ozasa | ...................... | H03L 7/089 327/12 |

FOREIGN PATENT DOCUMENTS

JP   2012-114716   6/2012

* cited by examiner

*Primary Examiner* — Adam Houston
(74) *Attorney, Agent, or Firm* — Michael Best and Friedrich LLP

(57) ABSTRACT

An electronic circuit includes a plurality of delay elements configured to delay a clock signal by a delay time and to supply the delayed clock signal as a delay signal, the delay time being shorter with a higher power source voltage; a delay time acquisition unit configured to acquire the delay time based on a value of the delay signal; and a voltage controller configured to perform a voltage control process in which the power source voltage is controlled to be high in a case where the acquired delay time is longer than a predetermined desired value and the power source voltage is controlled to be low in a case where the acquired delay time is shorter than the predetermined desired value.

11 Claims, 12 Drawing Sheets

ELECTRONIC CIRCUIT, METHOD OF CONTROLLING ELECTRONIC CIRCUIT, AND ELECTRONIC APPARATUS

CROSS REFERENCE TO RELATED APPLICATIONS

This application claims the benefit of Japanese Priority Patent Application JP 2014-044472 filed Mar. 7, 2014, the entire contents of which are incorporated herein by reference.

BACKGROUND

The present disclosure relates to an electronic circuit, a method of controlling the electronic circuit, and an electronic apparatus, and particularly to an electronic circuit provided with a time digital converter, a method of controlling the electronic circuit, and an electronic apparatus.

In the past, a time digital converter may be used to detect the phase of a clock signal in an electronic circuit. The time digital converter generally includes a plurality of stages of delay elements and a plurality of flip-flops. A plurality of delay signals, which are delayed clock signals, are generated by the plurality of delay elements. Data including values of the plurality of delay signals is stored in the flip-flop as a time-to-digital converter (TDC) code. If the respective delay times of the plurality of delay elements are the same as a predetermined design value, the phase of the clock signal can be accurately detected based on the TDC code. However, the delay time of the delay element in the time digital converter varies depending on conditions such as a process, a power source voltage, and a temperature. The delay time deviates from the design value due to the variation of the delay time, and thus, an error may occur in the phase represented by the TDC code.

In order to correct the error, a time digital converter including a plurality of stages of delay elements, each of which includes a transistor inserted between the respective power source terminals thereof as a current source, a flip-flop, and a calibration control circuit has been proposed (see, for example, Japanese Patent Application Laid-open No. 2012-114716). In the time digital converter, the calibration control circuit reads the TDC data from the flip-flop, and obtains an error in the TDC data. Then, the calibration control circuit corrects the amount of current flowing from the current source to the delay element to a value in which the error is reduced. With the correction of the current amount, the delay time of the delay element has a value close to the predetermined design value.

SUMMARY

In the existing techniques described above, however, the delay time of the delay element is prolonged as compared with the case where no current source is provided because a voltage drop depending on the impedance of the current source occurs on the side of the power source of the delay element. Thus, the time resolution of the time digital converter is degraded due to the prolonged delay time. Moreover, if the delay time is prolonged, the delay time may deviate from the design value and an error may remain in the TDC code.

The present disclosure has been made in view of the above circumstances, and it is desirable to control the delay time of the delay element to have a predetermined value.

According to a first embodiment of the present disclosure, there are provided an electronic circuit including a plurality of delay elements configured to delay a clock signal by a delay time and to supply the delayed clock signal as a delay signal, the delay time being shorter with a higher power source voltage, a delay time acquisition unit configured to acquire the delay time based on a value of the delay signal, and a voltage controller configured to perform a voltage control process in which the power source voltage is controlled to be high in a case where the acquired delay time is longer than a predetermined desired value and the power source voltage is controlled to be low in a case where the acquired delay time is shorter than the predetermined desired value, and a method of controlling the electronic circuit. Accordingly, an operation in which the power source voltage is controlled to be high in the case where the delay time is longer than a predetermined desired value and the power source voltage is controlled to be low in the case where the delay time is shorter than the predetermined desired value is provided.

Moreover, in the first embodiment, the voltage controller may be configured to perform the voltage control process when the power source voltage is supplied to the plurality of delay elements. Accordingly, an operation in which the voltage control process is performed when the power source voltage is supplied to the plurality of delay elements is provided.

Moreover, in the first embodiment, the electronic circuit may further include a temperature measurement unit configured to measure a temperature in the electronic circuit, the voltage controller being configured to perform the voltage control process in a case where the measured temperature is out of a predetermined range. Accordingly, an operation in which the voltage control process is performed when the measured temperature is out of the predetermined range is provided.

Moreover, in the first embodiment, the voltage controller may be configured to perform the voltage control process at every predetermined period. Accordingly, an operation in which the voltage control process is performed at every predetermined period is provided.

Moreover, in the first embodiment, the electronic circuit may further include a first power source circuit configured to supply a first voltage as the power source voltage, and a second power source circuit configured to supply a second voltage that is different from the first voltage, the voltage controller being configured to control the second voltage based on a control amount of the power source voltage. Accordingly, an operation in which the second voltage is controlled based on the control amount of the power source voltage is provided.

Moreover, in the first embodiment, the electronic circuit may further include a first power source circuit configured to supply a first voltage as the power source voltage, a second power source circuit configured to supply a second voltage that is different from the first voltage, and a power source management unit configured to control the second voltage based on a control amount of the power source voltage controlled by the voltage controller. Accordingly, an operation in which the second voltage is controlled based on the control amount of the power source voltage is provided.

Moreover, in the first embodiment, the voltage controller may be configured to search a plurality of voltages for such search target voltage that a difference between the delay time and the predetermined desired value is minimum, and to control the power source voltage to be the searched search target voltage. Accordingly, an operation in which the power source voltage is controlled to be such search target voltage that the difference between the delay time and the predetermined desired value is minimum is provided.

Moreover, in the first embodiment, the voltage controller may be configured to use a linear search algorithm to search for the search target voltage. Accordingly, an operation in which the linear search algorithm is used to search for the search target voltage is provided.

Moreover, in the first embodiment, the voltage controller may be configured to use a binary search algorithm to search for the search target voltage. Accordingly, an operation in which the binary search algorithm is used to search for the search target voltage is provided.

Moreover, according to a second embodiment of the present disclosure, there is provided an electronic apparatus including a plurality of delay elements configured to delay a clock signal by a delay time and to supply the delayed clock signal as a delay signal, the delay time being shorter with a higher power source voltage, a delay time acquisition unit configured to acquire the delay time based on a value of the delay signal, a voltage controller configured to perform a voltage control process in which the power source voltage is controlled to be high in a case where the acquired delay time is longer than a predetermined desired value and the power source voltage is controlled to be low in a case where the acquired delay time is shorter than the predetermined desired value, and a processing circuit configured to perform a predetermined process in synchronization with the clock signal. Accordingly, an operation in which the power source voltage is controlled to be high in the case where the delay time is longer than a predetermined desired value and the power source voltage is controlled to be low in the case where the delay time is shorter than the predetermined desired value is provided.

According to the present disclosure, it is possible to achieve such excellent effects that the delay time of the delay element can be controlled to have a predetermined value. It should be noted that the effect described herein is not necessarily restrictive, and additional effects may be provided.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments for carrying out the present disclosure (hereinafter, referred to as embodiments) will be described. The description will be made in the following order.

1. First embodiment (Example in which power source voltage is controlled)
2. Second embodiment (Example in which power source voltage is controlled when temperature changes)
3. Third embodiment (Example in which power source voltage is controlled at every predetermined period)
4. Fourth embodiment (Example in which plurality of power source voltages are controlled)
5. Fifth embodiment (Example in which power source management unit is provided to control plurality of power source voltages)

1. First Embodiment

Configuration Example of Semiconductor Integrated Circuit

Figure 1:
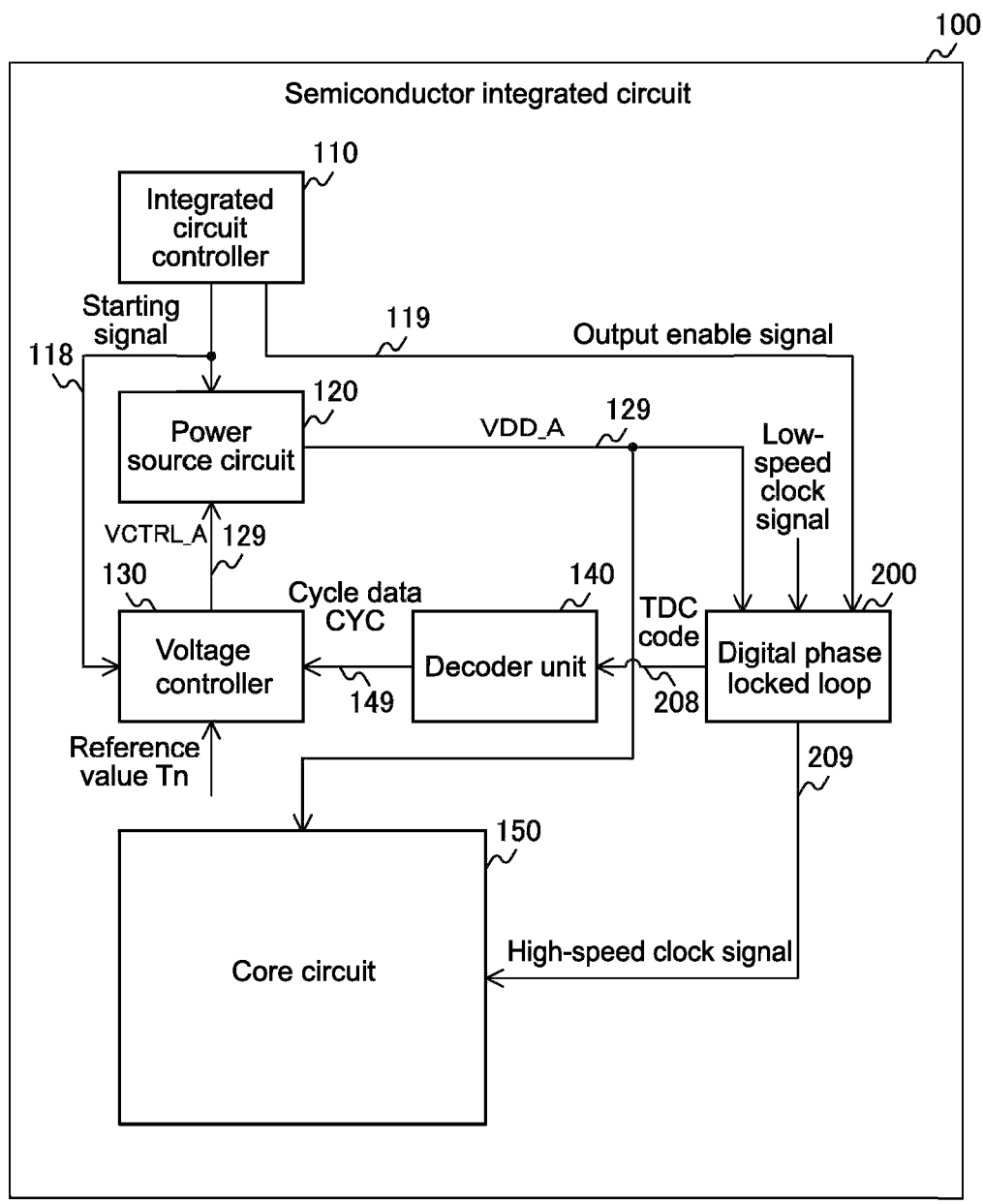
FIG. 1 is a block diagram showing a configuration example of a semiconductor integrated circuit according to a first embodiment of the present disclosure.

FIG. 1 is a block diagram showing a configuration example of a semiconductor integrated circuit 100 according to a first embodiment of the present disclosure. The semiconductor integrated circuit 100 includes an integrated circuit controller 110, a power source circuit 120, a voltage controller 130, a decoder unit 140, a digital phase locked loop 200, and a core circuit 150. The semiconductor integrated circuit 100 is provided to an electronic apparatus that performs processes such as an audio process, an image process, and a communication process. It should be noted that the semiconductor integrated circuit 100 is an example of the electronic circuit according to an embodiment of the present disclosure.

The integrated circuit controller 110 is configured to control the entire semiconductor integrated circuit 100. When power is applied to the semiconductor integrated circuit 100, the integrated circuit controller 110 causes the power source circuit 120 to start the supply of a power source voltage by supplying a starting signal via a signal line 118, and causes the voltage controller 130 to start the control of the power source voltage. Moreover, the integrated circuit controller 110 supplies an output enable signal to the digital phase locked loop 200 via a signal line 119. The output enable signal controls the output operation of a high-speed clock signal. The integrated circuit controller 110 turns off the output enable signal to cause the digital phase locked loop 200 to stop outputting the clock signal for a predetermined period, from when the correction of the power source voltage is started. When the predetermined period elapses, the integrated circuit controller 110 turns on the output enable signal and causes the digital phase locked loop 200 to start outputting the clock signal. The period from when power is applied to the semiconductor integrated circuit 100 to when the output enable signal is turned on is set to an enough period to complete the control of a power source voltage VDD_A to be described later.

The power source circuit 120 is configured to supply the power source voltage VDD_A to the digital phase locked loop 200, the core circuit 150, and the like. The power source circuit 120 starts the supply of the power source voltage VDD_A in accordance with the starting signal from the integrated circuit controller 110. Moreover, the power source circuit 120 is configured to change the value of the power source voltage VDD_A in a predetermined control range under control by the voltage controller 130. For example, the power source circuit 120 includes a constant voltage circuit (regulator or the like) including a variable resistance, and changes the value of the power source voltage VDD_A by changing the resistance value of the variable resistance. It should be noted that the power source circuit 120 is an example of the first power source circuit according to an embodiment of the present disclosure.

The digital phase locked loop 200 is configured to multiply a low-speed clock signal and to supply the multiplied signal as a lock signal. The digital phase locked loop 200 includes a time digital converter that generates a TDC code, and uses the TDC code to generate a high-speed clock signal based on the low-speed clock signal. Moreover, the digital phase locked loop 200 supplies the TDC code to the decoder unit 140 via a signal line 208, and supplies the high-speed clock signal to the core circuit 150 via a signal line 209 in accordance with the output enable signal.

The core circuit 150 is configured to perform processes such as an audio process, an image process, and a communication process in synchronization with the high-speed clock signal. For example, in the core circuit 150, an audio process, an image process, a communication process, and the like are performed. It should be noted that the core circuit 150 is an example of the processing unit according to an embodiment of the present disclosure.

The decoder unit 140 is configured to obtain the cycle of the high-speed clock signal based on the TDC code, and to generate cycle data CYC that represents the cycle. The decoder unit 140 supplies the generated cycle data CYC to the voltage controller 130 via a signal line 149. The cycle represented by the cycle data CYC is longer with a longer delay time of the delay element in the time digital converter. It should be noted that the decoder unit 140 is an example of the delay time acquisition unit according to an embodiment of the present disclosure.

The voltage controller 130 is configured to supply control data VCTRL_A to the power source circuit 120 via a signal line 129 to control the power source voltage VDD_A so that the delay time of the delay element has a desired value Tg. In general, the delay time of the delay element is shorter with a higher value of the power source voltage VDD_A. The voltage controller 130 increases the power source voltage VDD_A in a predetermined control range based on the properties of the delay element in the case where the cycle represented by the cycle data CYC is longer than a predetermined reference value Tn. On the other hand, the voltage controller 130 decreases the power source voltage VDD_A in the predetermined control range in the case where the cycle represented by the cycle data CYC is shorter than the predetermined reference value Tn.

Here, in the case where the power source circuit 120 can control the power source voltage VDD_A to be a plurality of stages of voltages, it is desirable that the voltage controller 130 searches the plurality of stages of voltages for such a voltage that the cycle is closest to the reference value Tn and controls the power source voltage VDD_A to be the searched voltage. For example, the voltage controller 130 gradually increases/decreases the voltage in a predetermined control range, and searches for such a voltage that the cycle is closest to the reference value Tn.

As described above, the cycle represented by the cycle data CYC has a higher value with a longer delay time of the delay element in the time digital converter. Therefore, by controlling the power source voltage VDD_A so that the cycle is the reference value Tn, the delay time of the delay element is controlled to have the desired value Tg corresponding to the reference value Tn.

(Configuration Example of Digital Phase Locked Loop)

Figure 2:
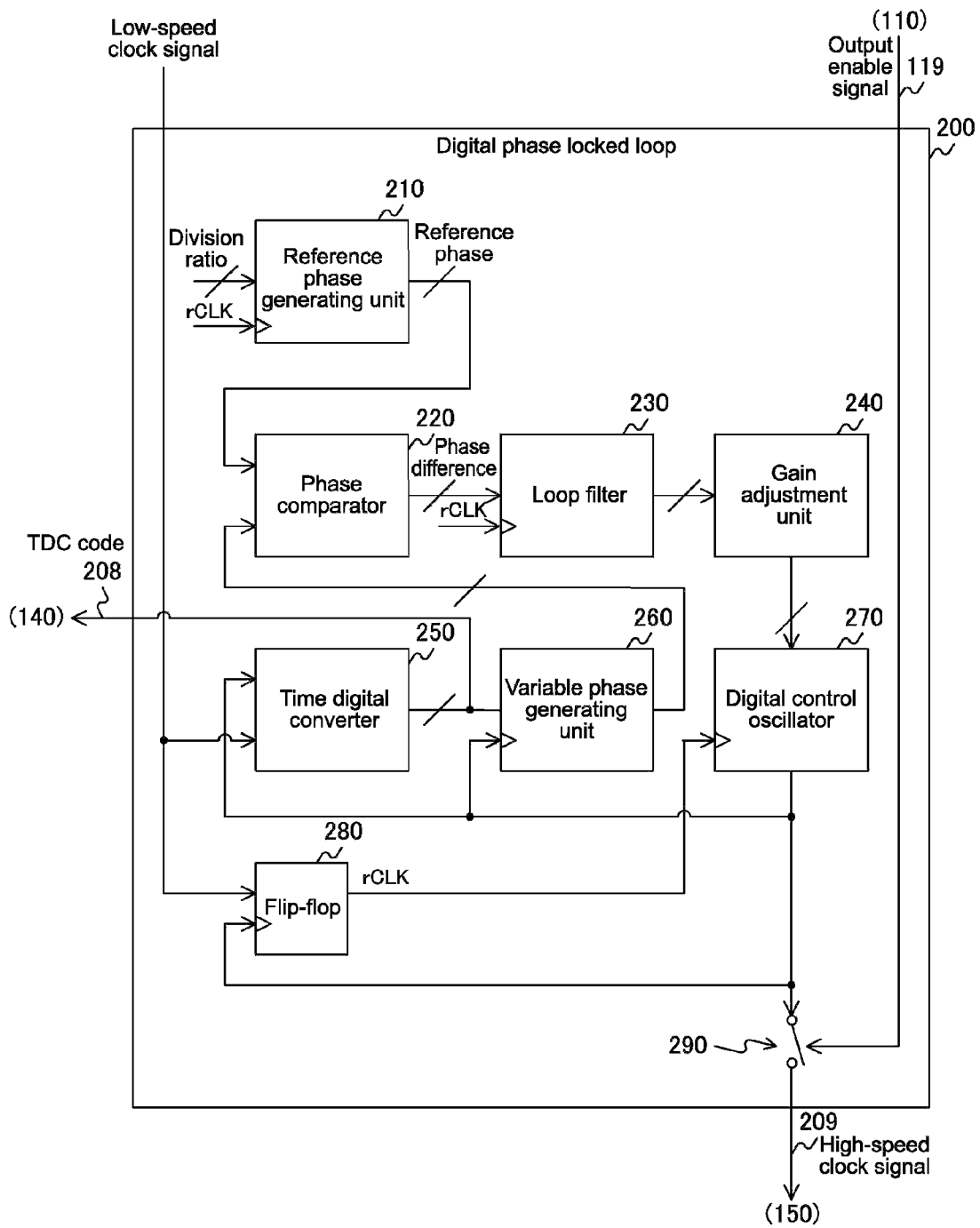
FIG. 2 is a block diagram showing a configuration example of a digital phase locked loop according to the first embodiment.

FIG. 2 is a block diagram showing a configuration example of the digital phase locked loop 200 according to the first embodiment. The digital phase locked loop 200 includes a reference phase generating unit 210, a phase comparator 220, a loop filter 230, a gain adjustment unit 240, a time digital converter 250, a variable phase generating unit 260, a digital control oscillator 270, a flip-flop 280, and a switch 290.

The reference phase generating unit 210 is configured to generate a reference phase code that represents a reference phase based on a predetermined division ratio DIV in synchronization with a clock signal rCLK. The clock signal rCLK will be described later. The reference phase generating unit 210 generates, as the reference phase, the phase of the clock signal that has divided the high-speed clock signal with the division ratio DIV, for example. The reference phase generating unit 210 supplies data that represents the generated reference phase to the phase comparator 220.

The time digital converter 250 is configured to detect the phase of the high-speed clock signal relative to the phase of the low-speed clock signal. The time digital converter 250 supplies the TDC data that represents the detected phase to the decoder unit 140 and the variable phase generating unit 260.

The variable phase generating unit 260 is configured to generate a variable phase code that represents the phase represented by the TDC code in the same data format as that of the reference phase code in synchronization with the high-speed clock signal. The variable phase generating unit 260 supplies the variable phase code to the phase comparator 220.

The phase comparator 220 is configured to compare the reference phase represented by the reference phase code and the variable phase represented by the variable phase code, and to detect the phase difference therebetween. The phase comparator 220 supplies phase difference data that represents the detected phase difference to the loop filter 230.

The loop filter 230 is configured to perform a process of reducing the noise component of a frequency band higher than a predetermined cutoff frequency on the phase difference data in synchronization with the clock signal rCLK. As the loop filter 230, an infinite impulse response (IIR) filter or a finite impulse response (FIR) filter is used, for example. The loop filter 230 supplies the phase difference data having the reduced high-frequency component to the gain adjustment unit 240.

The gain adjustment unit 240 is configured to perform a process for adjusting the gain of the digital control oscillator 270 on the phase difference data, and to supply the processed data to the digital control oscillator 270.

The digital control oscillator 270 is configured to generate a high-speed clock signal based on the phase difference data in synchronization with the clock signal rCLK. For example, a numerically controlled oscillator is used as the digital control oscillator 270. The digital control oscillator 270 supplies the high-speed clock signal to the time digital converter 250, the variable phase generating unit 260, the flip-flop 280, and the switch 290.

The flip-flop 280 is configured to hold a low-speed clock signal, and to output the held signal as the clock signal rCLK in synchronization with the high-speed clock signal. Accordingly, retiming is performed on the low-speed clock signal by the high-speed clock signal. The clock signal rCLK is supplied to the reference phase generating unit 210, the loop filter 230, and the digital control oscillator 270.

The switch 290 is configured to open/close a path between the digital control oscillator 270 and the core circuit 150 in accordance with the output enable signal. For example, when the output enable signal is controlled to be turned on, the switch 290 is in a state of "close." When the output enable signal is controlled to be turned off, the switch 290 is in a state of "open."

It should be noted that although the configuration in which the voltage controller 130 and the decoder unit 140 are provided outside of the time digital converter 250 is used, the present disclosure is not limited to the configuration. For example, at least one of the voltage controller 130 and the decoder unit 140 may be provided inside of the time digital converter 250.

(Configuration Example of Time Digital Converter)

Figure 3:
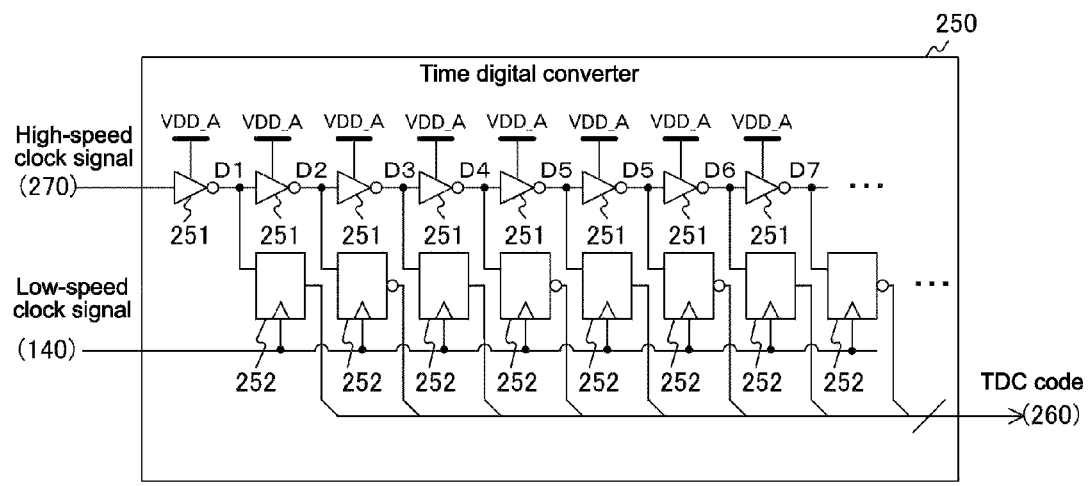
FIG. 3 is a circuit diagram showing a configuration example of a time digital converter according to the first embodiment.

FIG. 3 is a circuit diagram showing a configuration example of the time digital converter 250 according to the first embodiment. The time digital converter 250 includes N (N represents an integer of two or more) stages of delay elements 251 and N flip-flops 252. Moreover, the delay elements 251 are commonly connected to the power source circuit 120, and the power source voltage VDD_A is supplied to the delay elements 251. Moreover, the respective flip-flops 252 are connected to the respective delay elements 251. It should be noted that the number N of the stages of the delay elements 251 is favorably such a value that the total delay times of the delay elements 251 cover the period of one cycle of the high-speed clock signal.

The delay elements 251 are each configured to delay an input clock signal. As the delay element 251, an inverter is used, for example. The delay element 251 delays the high-speed clock signal and supplies the delayed signal to the delay element 251 at the second stage and the corresponding flip-flop 252 as a delay signal. The delay elements 251 at the second stage and the subsequent stages each delay a delay signal supplied from the delay element 251 the previous stage, and supply the delayed signal to the delay element 251 at the subsequent stage and the corresponding flip-flop 252.

The flip-flops 252 are each configured to hold the value of the delay signal. The flip-flop 252 holds the value of the delay signal supplied from the corresponding delay element 251 in synchronization with the low-speed clock signal, and supplies the held value to the decoder unit 140 and the variable phase generating unit 260. It should be noted that the flip-flops 252 corresponding to the delay elements 251 at even-numbered stages invert the value of the delay signal and supply the inverted value. N bits of data including these values are supplied to the decoder unit 140 and the like as the TDC code.

As shown in FIG. 3, in the time digital converter 250, a current source is not inserted between the delay elements 251 and the power source circuit 120 as in the configuration disclosed in Japanese Patent Application Laid-open No. 2012-114716. Therefore, there is no risk that the time resolution of the time digital converter 250 is degraded by the voltage drop of the current source.

Figure 4:
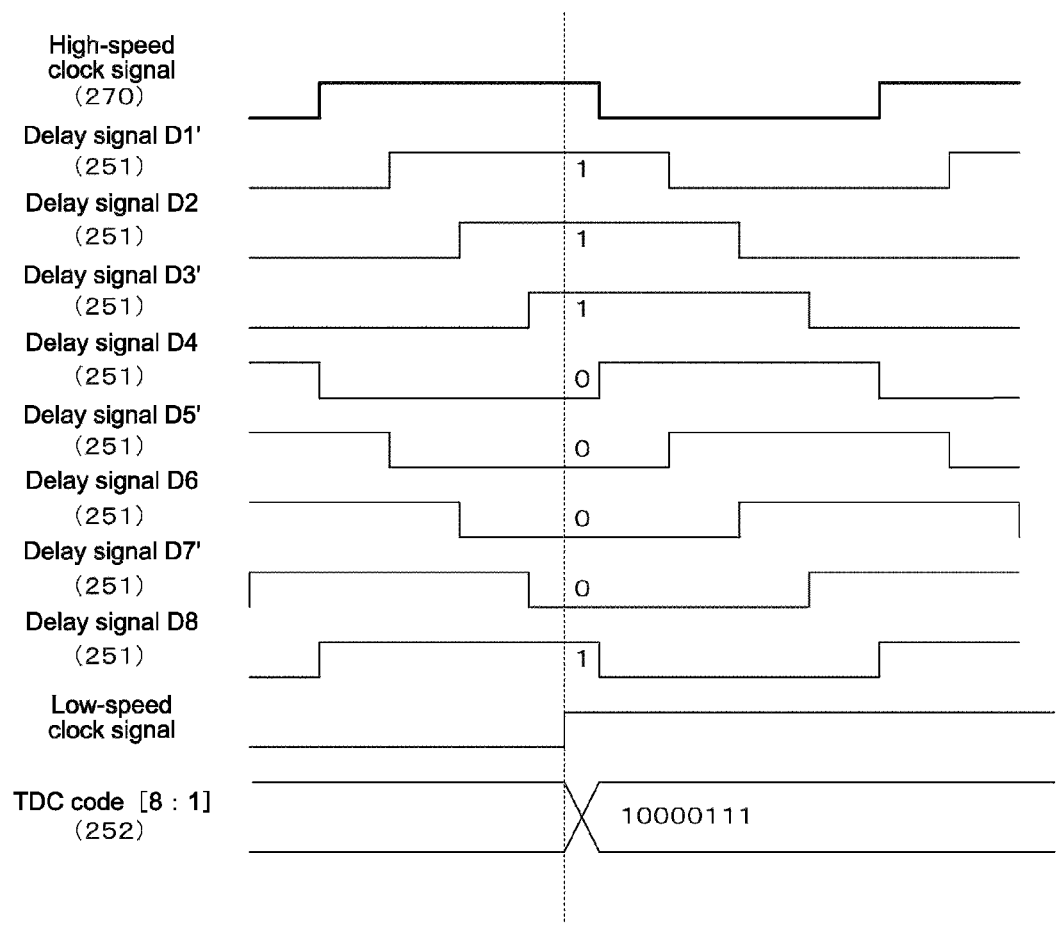
FIG. 4 is a timing chart showing an example of the operation of the time digital converter according to the first embodiment.

FIG. 4 is a timing chart showing an example of the operation of the time digital converter 250 according to the first embodiment. The delay element 251 at the first stage delays the high-speed clock signal supplied from the digital control oscillator 270, and outputs the delayed signal to the delay element 251 at the subsequent stage as a delay signal D1. Moreover, the delay elements 251 at the second to eighth stages delay the clock signals supplied from the delay elements 251 at the previous stages, and output the delayed signals to the delay elements 251 at the subsequent stages as delay signals D2 to D8, respectively. Moreover, the values of the delay signals D1 to D8 are held in the corresponding flip-flops 252. It should be noted that in FIG. 4, waveforms of delay clock signals D1', D3', D5', and D7', which are obtained by inverting the delay signals D1, D3, D5, and D7, are described for the delay elements 251 at odd-numbered stages instead of the delay signals D1, D3, D5, and D7, for convenience of description.

The code including the held value of the delay clock signal is output as the TDC code in synchronization with the low-speed clock signal.

For example, in the case where the delay signals D1', D2, D3', and D8 are at high levels at the timing of a positive-going edge of the low-speed clock signal and the other delay signals are at low levels, 8 bits of TDC code, "10000111," is generated.

The TDC code represents the phase of the edge of the high-speed clock signal relative to the edge of the low-speed clock signal. For example, the timing when the bit in the TDC code changes from "0" to "1" or from "1" to "0" represents the timing of the positive-going edge or negative-going edge of the high-speed clock signal.

Based on the TDC data, the decoder unit 140 generates cycle data. For example, data representing the number Bn of bits from a positive-going edge to a next positive-going edge (i.e., the number of stages of the delay elements) is generated as cycle data. In order to obtain data with high accuracy, the decoder unit 140 may obtain the bit number Bn a plurality of times, and calculate data representing the average value thereof as the cycle data. If the delay time of the individual delay element 251 is represented by Td and the actual cycle of the high-speed clock signal is represented by Tc, the quotient obtained by dividing the cycle Tc by the bit number Bn represents the delay time Td. The voltage controller 130 controls the power source voltage VDD_A so that the bit number Bn is a predetermined reference value. Thus, the delay time Td is controlled to be the desired value Tg that is equal to the quotient obtained by dividing the cycle Tc by the reference value Tn.

Figure 5:
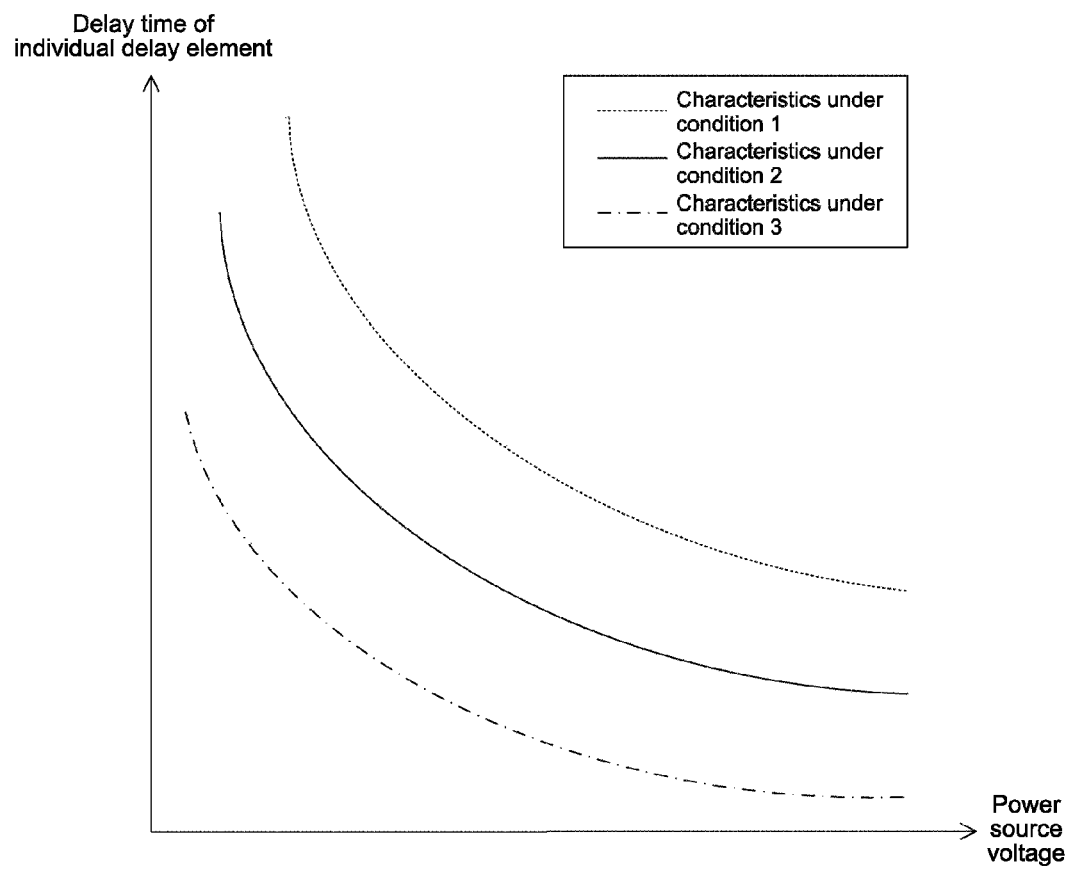
FIG. 5 is a graph showing the relationship between a delay time of a delay element and a power source voltage according to the first embodiment.

FIG. 5 is a graph showing an example of the relationship between a delay time of a delay element and a power source voltage according to the first embodiment. In FIG. 5, the vertical axis represents the respective delay time of the delay element 251, and the horizontal axis represents the power source voltage of the delay element 251. Moreover, corves of the dotted line, the solid line, and the alternate long and short dash line represent the characteristics of the delay element measured under conditions with different temperatures and processes. As shown in FIG. 5, the delay time of the delay element is prolonged with a lower power source voltage. Moreover, the delay time varies depending on conditions such as a process and a temperature in addition to the power source voltage.

(Operational Example of Voltage Controller 130)

Figure 6:
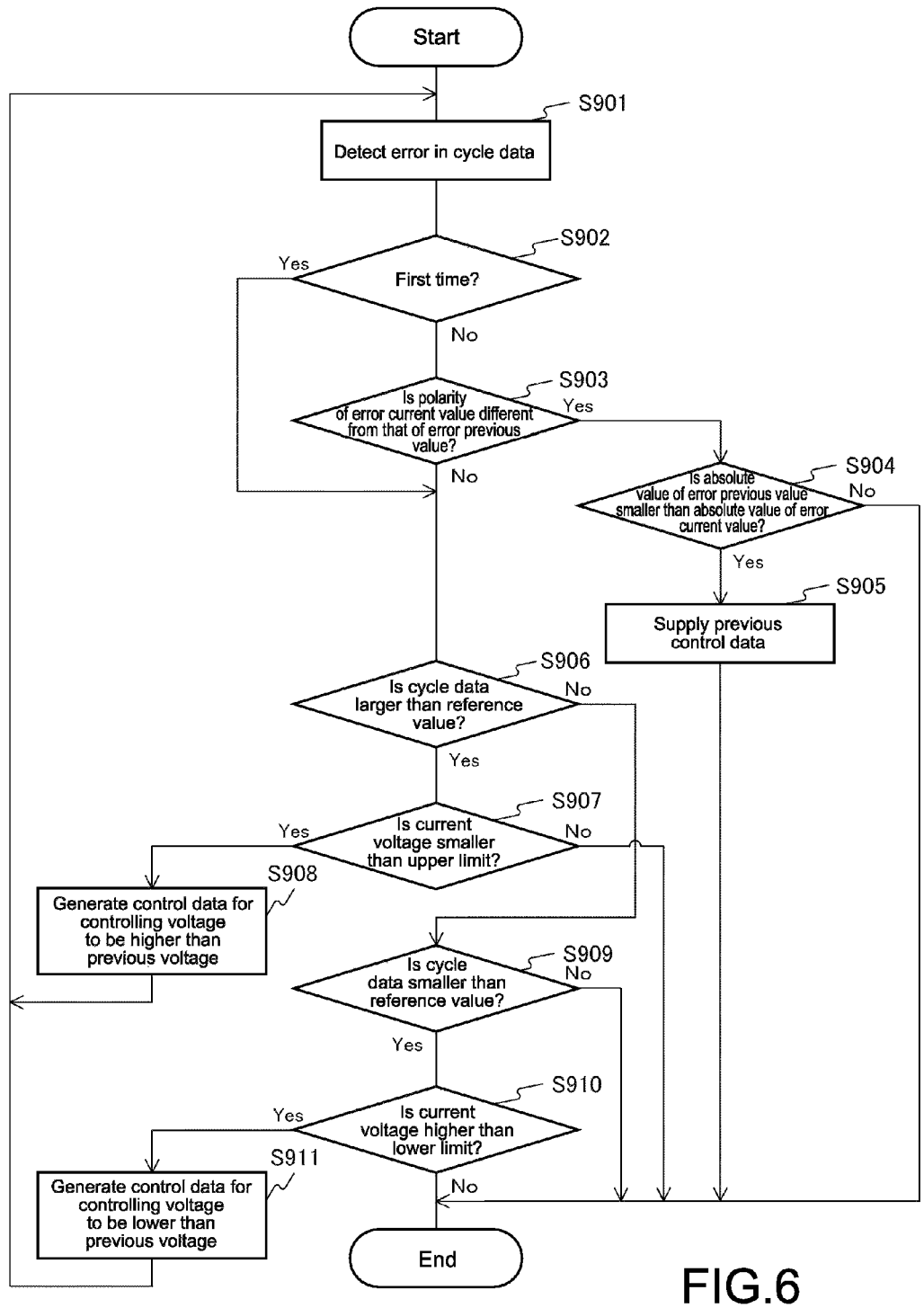
FIG. 6 is a flowchart showing an example of the operation of a voltage controller according to the first embodiment.

FIG. 6 is a flowchart showing an example of the operation of the voltage controller 130 according to the first embodiment. The operation is performed when power is applied to the semiconductor integrated circuit 100, for example.

The voltage controller 130 is configured to detect the difference between the bit number Bn, which is represented by the cycle data CYC, and the reference value Tn as an error. For example, the value obtained by subtracting the reference value Tn from the bit number Bn is detected as an error (Step S901). The voltage controller 130 determines whether or not the detection of an error is performed for the first time (Step S902).

In the case where the detection of an error is performed for the second or subsequent times (Step S902: No), the voltage controller 130 determines whether or not the polarity of the current value of the error is different from the polarity of the previous value (Step S903). Hereinafter, the current value and the previous value of the error will be referred to as "error current value" and "error previous value," respectively.

In the case where the polarity of the error current value is different from that of the error previous value (Step S903: Yes), the voltage controller 130 determines whether or not the absolute value of the error previous value is smaller than the absolute value of the error current value (Step S904). In the case where the absolute value of the error previous value is smaller than the absolute value of the error current value (Step S904: Yes), the voltage controller 130 supplies the previous control data VCTRL_A.

In the case where the detection of an error is performed for the first time (Step S902: Yes), the voltage controller 130 determines whether or not the value represented by the cycle data (e.g., bit number Bn) is larger than the reference value Tn based on the polarity of the error current value (Step S906). Moreover, also in the case where the polarity of the error current value is the same as that of the error previous value (Step S903: No), the voltage controller 130 performs the process of Step S906.

In the case where the value represented by the cycle data is larger than the reference value Tn (Step S906: Yes), the voltage controller 130 determines whether or not the current power source voltage VDD_A is smaller than the upper limit (Step S907). In the case where the current power source voltage VDD_A is smaller than the upper limit (Step S907: Yes), the voltage controller 130 generates control data for controlling the power source voltage VDD_A to be a voltage higher than the previous voltage by a constant voltage dV, and supplies the generated control data. Accordingly, the power source voltage VDD_A is increased by the amount corresponding to the constant voltage dV (Step S908). After Step S908, the voltage controller 130 returns to Step S901.

Moreover, in the case where the value represented by the cycle data is not more than the reference value Tn (Step S906: No), the voltage controller 130 determines whether or not the value represented by the cycle data is smaller than the reference value Tn (Step S909).

In the case where the value represented by the cycle data is smaller than the reference value Tn (Step S909: Yes), the voltage controller 130 determines whether or not the current power source voltage VDD_A is higher than the lower limit (Step S910). In the case where the current power source voltage VDD_A is higher than the lower limit (Step S910: Yes), the voltage controller 130 generates control data for controlling the power source voltage VDD_A to be a voltage lower than the previous voltage by the constant voltage dV, and supplies the generated control data. Accordingly, the power source voltage VDD_A is reduced by the amount corresponding to the constant voltage dV (Step S911). After Step S911, the voltage controller 130 returns to Step S901.

In the case where the current power source voltage is not less the upper limit (Step S907: No) or not more than the lower limit (Step S910: No), or the cycle data equals to the reference value Tn (Step S909: No), the voltage controller 130 terminates the operation to control a voltage. Moreover, in the case where the absolute value of the error previous value is not less than that of the error current value (Step S904: No), or after Step S905, the voltage controller 130 terminates the operation to control a voltage. After the operation is terminated, the control data output at the end is held and the power source voltage VDD_A is maintained to be the voltage represented by the data.

It should be noted that although the voltage controller 130 controls the power source voltage VDD_A to be a voltage having the minimum error, it is not limited thereto as long as the control is performed so that the error is reduced. For example, in the case where the process of Step S908 or Step S911 in which the voltage is increased or reduced is performed a predetermined number of times, or where the error is minimum, the control may be finished.

Figure 7:
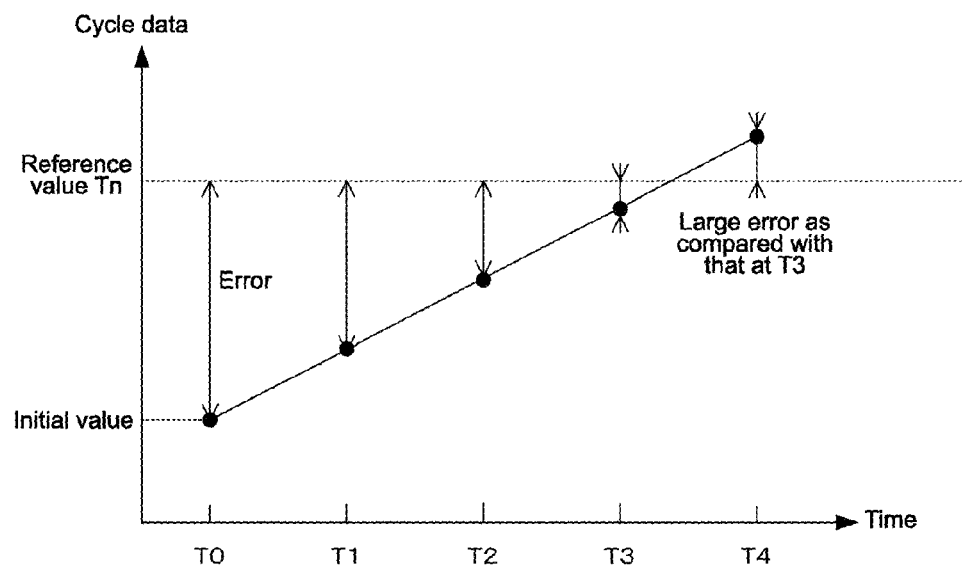
FIG. 7 is a diagram showing an example of correction results of cycle data according to the first embodiment.

FIG. 7 is a diagram showing an example of correction results of cycle data according to the first embodiment. In FIG. 7, the vertical axis represents the cycle represented by the cycle data CYC, and the horizontal axis represents time.

The assumption is made that power is applied at a time T0, and the control of the power source voltage VDD_A is started. At the time of the time T0, the value represented by the cycle data is smaller than the reference value Tn. In this case, the voltage controller 130 reduces the power source voltage VDD_A by the constant voltage dV. As a result, the delay time of the delay element 251 is prolonged and the cycle of the high-speed clock signal is prolonged. Therefore, at the time of a time T1, the error is reduced as compared with that at the time of the time T0.

Also at the time of the time T1, because the value represented by the cycle data is smaller than the reference value Tn, the voltage controller 130 further increases the power source voltage VDD_A. Then, also at the time of a time T2 and a time T3, the voltage controller 130 increases the power source voltage. As a result, at the time of a time T4, the value represented by the cycle data is larger than the reference value. In the case where the error at the time of the time T4 is larger than that at the time of the time T3, the voltage controller 130 controls the power source voltage to be a voltage at the time of the time T3 having a smaller error. On the other hand, the error at the time of the time T4 is lower than or equals to that at the time of the time T3, the power source voltage at the time of the time T4 is maintained.

As shown in FIG. 7, the voltage controller 130 searches for a voltage having the minimum error while increasing/reducing the power source voltage in the control range by a constant voltage. As described above, the search algorithm for searching for the target data (e.g., voltage having the minimum error) in order from the front position is called a linear search algorithm.

As described above, according to the first embodiment, because the voltage controller 130 performs control to increase the power source voltage in the case where the delay time of the delay element is longer than the desired value and to reduce the power source voltage in the case where the delay time of the delay element is shorter than the desired value, it is possible to control the delay time to have the desired value.

(Modified Example)

In the first embodiment, the voltage controller 130 searches for the voltage having the minimum error with a linear search algorithm. However, an algorithm other than the linear search algorithm may be used to search for the voltage. For example, the voltage controller 130 may use a binary search algorithm to search for the power source voltage. The voltage controller 130 according to a modified example of the first embodiment is different from that according to the first embodiment in that a binary search algorithm is used to search for the power source voltage.

Figure 8:
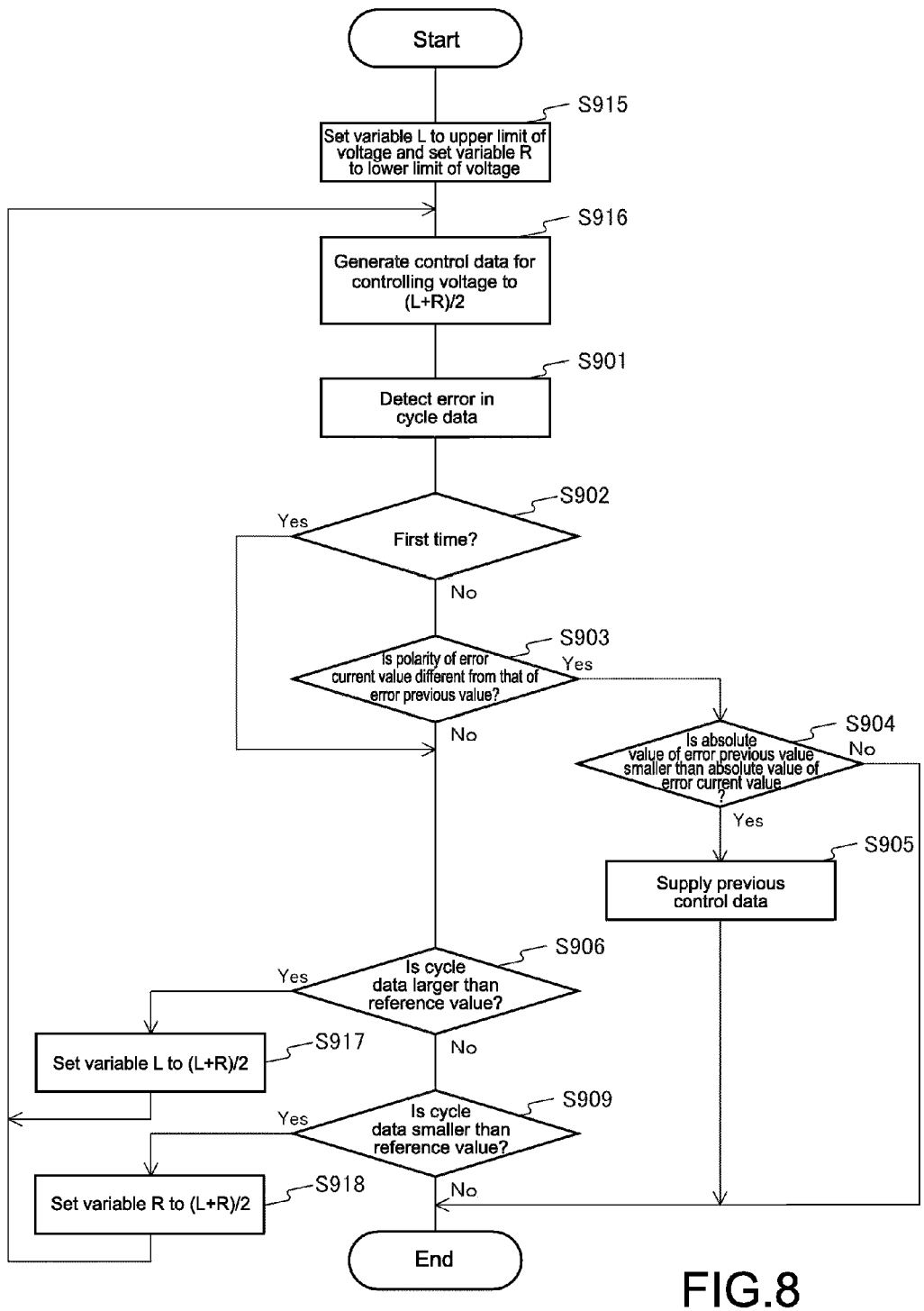
FIG. 8 is a flowchart showing an example of the operation of a voltage controller according to a modified example of the first embodiment.

FIG. 8 is a flowchart showing an example of the operation of the voltage controller 130 according to a modified example of the first embodiment. The operation of the voltage controller 130 according to the modified example is different from that according to the first embodiment in that the processes of Steps S915 to S918 are performed instead of Steps S907, S908, S910, and S911.

The voltage controller 130 is configured to set a variable L to the upper limit of the voltage in the control range, and set a variable R to the lower limit of the voltage (Step S915). Then, the voltage controller 130 generates control data for controlling the voltage to (L+R)/2, and supplies the generated control data (Step S916). The voltage controller 130 detects an error with respect to the reference value of the cycle data CYC (Step S901), and determines whether or not the detection of an error is performed for the first time (Step S902).

In the case where the detection of an error is performed for the second or subsequent times (Step S902: No), the voltage controller 130 performs the processes of Steps S904 and S905.

In the case where the detection of an error is performed for the first time (Step S902: Yes) or the polarity of the error current value is the same as that of the error previous value (Step S903: No), the voltage controller 130 determines whether or not the value represented by the cycle data is larger than the reference value (Step S906).

In the case where the value represented by the cycle data is larger than the reference value (Step S906: Yes), the voltage controller 130 sets the variable L to (L+R)/2 (Step S917), and returns to Step S916.

Moreover, in the case where the value represented by the cycle data is not more than the reference value (Step 906: No), the voltage controller 130 determines whether or not the value represented by the cycle data is smaller than the reference value (Step S909).

In the case where the value represented by the cycle data is smaller than the reference value (step S909: Yes), the voltage controller 130 sets the variable R to (L+R)/2 (Step S918) and returns to Step S916. In the case where the cycle data equals to the reference value (Step S909: No), the voltage controller 130 terminates the operation to control a voltage.

As described above, according to the modified example of the first embodiment, because the voltage controller 130 uses a binary search algorithm to make a search, it is possible to search for a voltage at higher speed than the case where a linear search algorithm is used.

2. Second Embodiment

In the first embodiment, the semiconductor integrated circuit 100 controls the power source voltage when power is applied. However, the power source voltage may be controlled at timing other than the timing when power is applied. Because the delay time of the delay element varies depending on also a temperature change, it is desirable to control the power source voltage also when the temperature is out of a predetermined temperature range, for example. The semiconductor integrated circuit 100 according to a second embodiment of the present disclosure is different from that according to the first embodiment in that the power source voltage is controlled also when the temperature is out of a predetermined temperature range.

Figure 9:
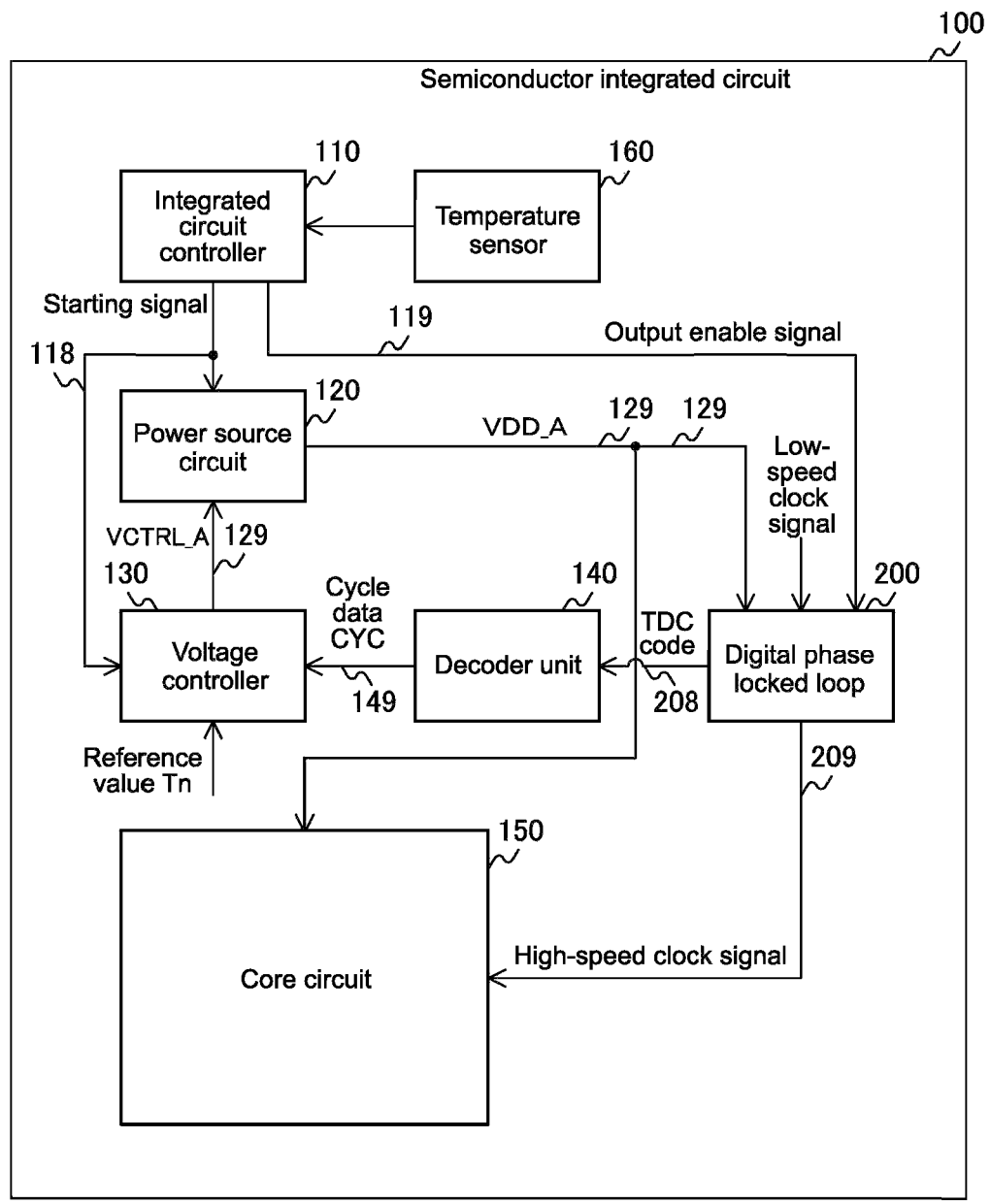
FIG. 9 is a block diagram showing a configuration example of a semiconductor integrated circuit according to a second embodiment of the present disclosure.

FIG. 9 is a block diagram showing a configuration example of the semiconductor integrated circuit 100 according to the second embodiment. The semiconductor integrated circuit 100 according to the second embodiment is different from that according to the first embodiment in that the semiconductor integrated circuit 100 further includes a temperature sensor 160.

The temperature sensor 160 is configured to measure the temperature of the semiconductor integrated circuit 100. The temperature sensor 160 supplies the value of the measured temperature to the integrated circuit controller 110. It should be noted that the temperature sensor 160 is an example of the temperature measurement unit according to an embodiment of the present disclosure.

The integrated circuit controller 110 according to the second embodiment causes the voltage controller 130 to start the control of the power source voltage in the case where power is applied or the temperature measured by the temperature sensor 160 is out of a predetermined temperature range. It should be noted that the integrated circuit controller 110 may cause the voltage controller 130 to start the control of the power source voltage only in the case where the temperature is out of a predetermined temperature range.

As described above, according to the second embodiment, because the voltage controller 130 controls the power source voltage when the temperature is out of a predetermined temperature range, it is possible to set the delay time of the delay element to be a desired value even when the temperature is out of a predetermined temperature range.

3. Third Embodiment

In the first embodiment, the semiconductor integrated circuit 100 controls the power source voltage when power is applied. However, the power source voltage may be controlled at every predetermined period. The semiconductor integrated circuit 100 according to a third embodiment of the present disclosure is different from that according to the first embodiment in that the power source voltage is controlled at ever predetermined period.

Figure 10:
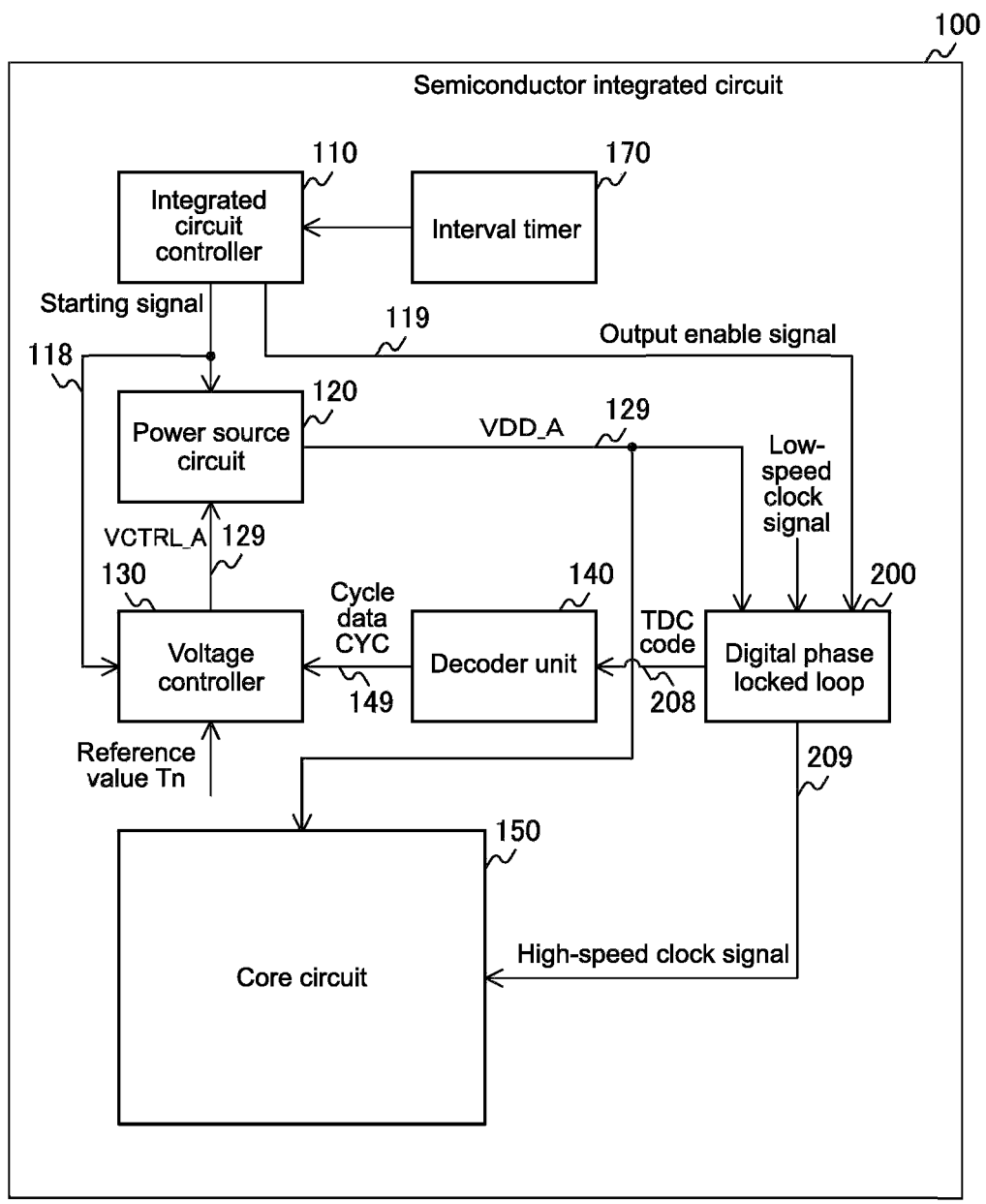
FIG. 10 is a block diagram showing a configuration example of a semiconductor integrated circuit according to a third embodiment of the present disclosure.

FIG. 10 is a block diagram showing a configuration example of the semiconductor integrated circuit 100 according to the third embodiment. The semiconductor integrated circuit 100 according to the third embodiment is different from that according to the first embodiment in that the semiconductor integrated circuit 100 further includes an interval timer 170.

The interval timer 170 is configured to measure time, to generate an event signal at every predetermined period, and to supply the generated event signal to the integrated circuit controller 110. The event signal notifies the elapse of the predetermined period.

The integrated circuit controller 110 is configured to cause the voltage controller 130 to start the control of the power source voltage in the case where power is applied or the event signal is supplied. It should be noted that the integrated circuit controller 110 may cause the voltage controller 130 to start the control of the power source voltage only in the case where the event signal is supplied.

As described above, according to the third embodiment, because the voltage controller 130 controls the power source voltage at every predetermines period, it is possible to control the delay time to be a desired value even in the case where the delay time varies due to the elapse of time.

4. Forth Embodiment

In the first embodiment, the semiconductor integrated circuit 100 controls only one power source voltage. However, the semiconductor integrated circuit 100 may control a plurality of power source voltages. The semiconductor integrated circuit 100 according to a fourth embodiment of the present disclosure is different from that according to the first embodiment in that the semiconductor integrated circuit 100 controls a plurality of power source voltages.

Figure 11:
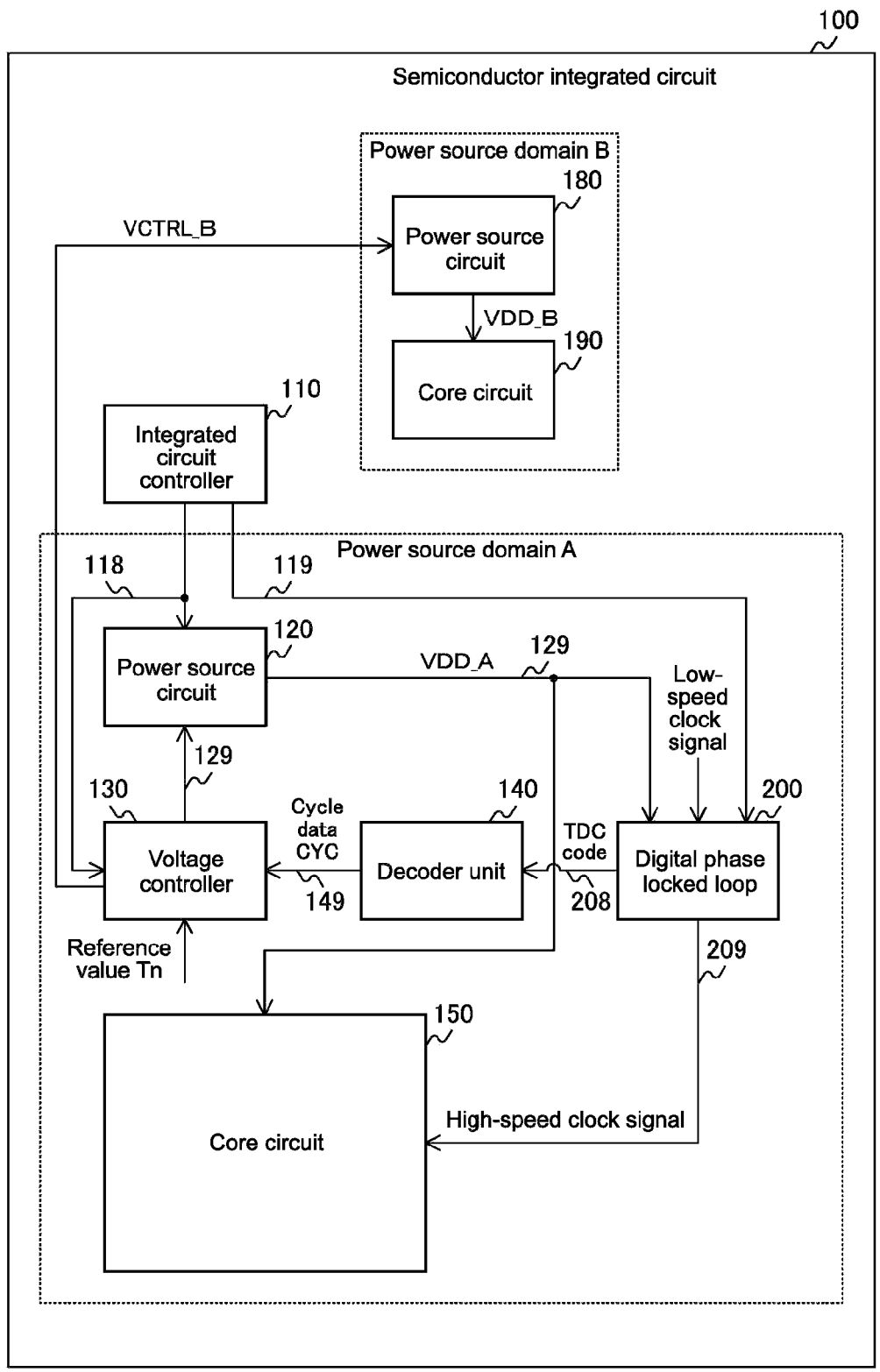
FIG. 11 is a block diagram showing a configuration example of a semiconductor integrated circuit according to a fourth embodiment of the present disclosure.

FIG. 11 is a block diagram showing a configuration example of the semiconductor integrated circuit 100 according to the fourth embodiment. To the semiconductor integrated circuit 100 according to the fourth embodiment, a power source domain A and a power source domain B are provided. The power source domain A is an area to which the power source voltage VDD_A is supplied, and the power source circuit 120, the voltage controller 130, the decoder unit 140, the core circuit 150, and the digital phase locked loop 200 are arranged in the power source domain A.

On the other hand, the power source domain B is an area to which a power source voltage VDD_B is supplied. The power source voltage VDD_B is different from the power source voltage VDD_A. A power source circuit 180 and a core circuit 190 are provided in the power source domain B.

The power source circuit 180 is configured to supply the power source voltage VDD_B to the core circuit 190 and the like. The core circuit 190 performs predetermined processes such as an audio process, an image process, and a communication process in synchronization with a high-speed clock signal. It should be noted that the power source circuit 180 is an example of the second power source circuit according to an embodiment of the present disclosure.

The voltage controller 130 according to the fourth embodiment is configured to control not only the power source voltage VDD_A but also the power source voltage VDD_B based on the control amount of the power source voltage VDD_A. The voltage controller 130 controls the power source voltage VDD_B by the amount corresponding to the control amount of the power source voltage VDD_A with control data VCTRL_B. It should be noted that the unit of the control amount may be volt (V) or percentage. For example, in the case where the power source voltage VDD_A is controlled by +0.01 V or +1%, the voltage controller 130 controls the power source voltage VDD_B by +0.01 V or +1%.

As described above, according to the fourth embodiment, because the voltage controller 130 controls the power source voltage VDD_B based on the control amount of the power source voltage VDD_A, it is possible to control the power source voltage in a plurality of power source domains.

5. Fifth Embodiment

In the first embodiment, the semiconductor integrated circuit 100 controls only one power source voltage. However, the semiconductor integrated circuit 100 may control a plurality of power source voltages. The semiconductor integrated circuit 100 according to a fifth embodiment of the present disclosure is different from that according to the first embodiment in that a power source management unit is further provided to control a plurality of power source voltages.

Figure 12:
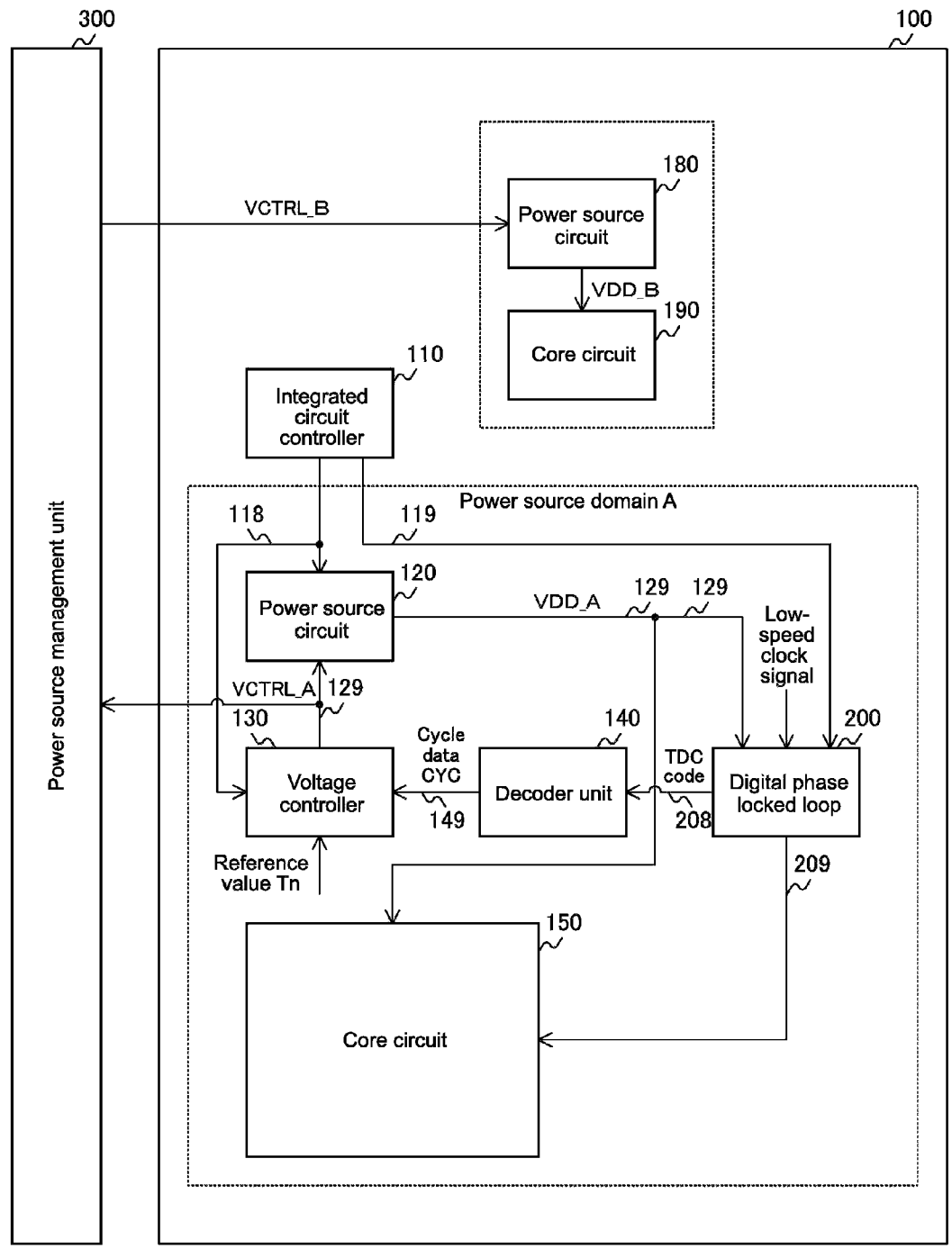
FIG. 12 is a bock diagram showing a configuration example of an electronic circuit according to a fifth embodiment of the present disclosure.

FIG. 12 is a bock diagram showing a configuration example of an electronic circuit according to the fifth embodiment. The electronic circuit is different from that according to the first embodiment in that the electronic circuit includes not only the semiconductor integrated circuit 100 but also a power source management unit 300.

Moreover, to the semiconductor integrated circuit 100 according to the fifth embodiment, the power source domain A and the power source domain B are provided. The power source domain A is an area to which the power source voltage VDD_A is supplied, and the power source circuit 120, the voltage controller 130, the decoder unit 140, the core circuit 150, and the digital phase locked loop 200 are provided to the power source domain A.

On the other hand, the power source domain B is an area to which the power source voltage VDD_B is supplied. The power source voltage VDD_B is different from the power source voltage VDD_A. Moreover, the power source circuit 180 and the core circuit 190 are provided to the power source domain B.

The voltage controller 130 according to the fifth embodiment is configured to supply the control data VCTRL_A not only to the power source circuit 120 but also to the power source management unit 300.

The power source circuit 180 is configured to supply the power source voltage VDD_B to the core circuit 190 and the like. The core circuit 190 is configured to perform predetermined processes such as an audio process, an image process, and a communication process in synchronization with a high-speed clock signal. It should be noted that the power source circuit 180 is an example of the second power source circuit according to an embodiment of the present disclosure.

The power source management unit 300 is configured to control the power source voltage VDD_B based on the control amount of the power source voltage VDD_A. The power source management unit 300 controls the power source voltage VDD_B by the amount corresponding to the control amount of the power source voltage VDD_A with the control data VCTRL_B. It should be noted that the unit of the control amount may be volt (V) or percentage. For example, in the case where the power source voltage VDD_A is controlled by +0.01 V or +1%, the power source management unit 300 controls the power source voltage VDD_B by +0.01 V or +1%.

As described above, according to the fifth embodiment, because the power source management unit 300 controls the power source voltage VDD_B based on the control amount of the power source voltage VDD_A, it is possible to control the power source voltage in a plurality of power source domains.

It should be noted that the embodiments of the present disclosure are shown as an example for implementing the present disclosure. The matters in the embodiments of the present disclosure have corresponding relations to the invention specifying matters in the claims. Similarly, the invention specifying matters in the claims have corresponding relations to the matters in the embodiments of the present disclosure having the same names as the invention specifying matters. It should be noted that the present disclosure is not limited to the above-mentioned embodiments and various modifications can be made without departing from the gist of the present disclosure.

Moreover, the process procedures described in the embodiments may be regarded as a method including the series of procedures, and may be regarded as a program that causes a computer to execute the series of procedures, or as a storage medium that stores the program. As the storage medium, a compact disc (CD), a minidisc (MD), a digital versatile disc (DVD), a memory card, a Blu-ray (registered trademark) disc may be used, for example.

It should be noted that the effects described above are not necessarily restrictive, and may be any of those described in the present disclosure.

It should be noted that the present disclosure may also take the following configurations.

(1) An electronic circuit, including:
a plurality of delay elements configured to delay a clock signal by a delay time and to supply the delayed clock signal as a delay signal, the delay time being shorter with a higher power source voltage;
a delay time acquisition unit configured to acquire the delay time based on a value of the delay signal; and
a voltage controller configured to perform a voltage control process in which the power source voltage is controlled to be high in a case where the acquired delay time is longer than a predetermined desired value and the power source voltage is controlled to be low in a case where the acquired delay time is shorter than the predetermined desired value.

(2) The electronic circuit according to (1) above, in which
the voltage controller is configured to perform the voltage control process when the power source voltage is supplied to the plurality of delay elements.

(3) The electronic circuit according to (1) or (2) above, further including
a temperature measurement unit configured to measure a temperature in the electronic circuit, the voltage controller being configured to perform the voltage control process in a case where the measured temperature is out of a predetermined range.

(4) The electronic circuit according to any one of (1) to (3) above, in which
the voltage controller is configured to perform the voltage control process at every predetermined period.

(5) The electronic circuit according to any one of (1) of (4) above, further including:
a first power source circuit configured to supply a first voltage as the power source voltage; and
a second power source circuit configured to supply a second voltage that is different from the first voltage, the voltage controller being configured to control the second voltage based on a control amount of the power source voltage.

(6) The electronic circuit according to any one of (1) to (4) above, further including:
a first power source circuit configured to supply a first voltage as the power source voltage;
a second power source circuit configured to supply a second voltage that is different from the first voltage; and
a power source management unit configured to control the second voltage based on a control amount of the power source voltage controlled by the voltage controller.

(7) The electronic circuit according to any one of (1) to (6) above, in which
the voltage controller is configured to search a plurality of voltages for such search target voltage that a difference between the delay time and the predetermined desired value is minimum, and to control the power source voltage to be the searched search target voltage.

(8) The electronic circuit according to (7) above, in which
the voltage controller is configured to use a linear search algorithm to search for the search target voltage.

(9) The electronic circuit according to (7) above, in which
the voltage controller is configured to use a binary search algorithm to search for the search target voltage.

(10) A method of controlling an electronic circuit, including:
acquiring a delay time based on a value of a delay signal supplied from a plurality of delay elements configured to delay the clock signal by the delay time and to supply the delayed clock signal as the delay signal, the delay time being shorter with a higher power source voltage; and
performing a voltage control process in which the power source voltage is controlled to be high in a case where the acquired delay time is longer than a predetermined desired value and the power source voltage is controlled to be low in a case where the acquired delay time is shorter than the predetermined desired value.

(11) An electronic apparatus, including:
a plurality of delay elements configured to delay a clock signal by a delay time and to supply the delayed clock signal as a delay signal, the delay time being shorter with a higher power source voltage;
a delay time acquisition unit configured to acquire the delay time based on a value of the delay signal;
a voltage controller configured to perform a voltage control process in which the power source voltage is controlled to be high in a case where the acquired delay time is longer than a predetermined desired value and the power source voltage is controlled to be low in a case where the acquired delay time is shorter than the predetermined desired value; and
a processing circuit configured to perform a predetermined process in synchronization with the clock signal.

It should be understood by those skilled in the art that various modifications, combinations, sub-combinations and alterations may occur depending on design requirements and other factors insofar as they are within the scope of the appended claims or the equivalents thereof.

What is claimed is:
1. An electronic circuit, comprising:
a plurality of delay elements configured to delay a clock signal by a delay time and to supply the delayed clock signal as a delay signal, the delay time being shorter with a higher power source voltage;
a delay time acquisition unit configured to acquire the delay time based on a value of the delay signal; and
a voltage controller configured to perform a voltage control process in which the power source voltage is controlled to be high in a case where the acquired delay time is longer than a predetermined desired value and the power source voltage is controlled to be low in a case where the acquired delay time is shorter than the predetermined desired value.

2. The electronic circuit according to claim 1, wherein
the voltage controller is configured to perform the voltage control process when the power source voltage is supplied to the plurality of delay elements.

3. The electronic circuit according to claim 1, further comprising
a temperature measurement unit configured to measure a temperature in the electronic circuit, the voltage controller being configured to perform the voltage control process in a case where the measured temperature is out of a predetermined range.

4. The electronic circuit according to claim 1, wherein
the voltage controller is configured to perform the voltage control process at every predetermined period.

5. The electronic circuit according to claim 1, further comprising:
a first power source circuit configured to supply a first voltage as the power source voltage; and
a second power source circuit configured to supply a second voltage that is different from the first voltage, the voltage controller being configured to control the second voltage based on a control amount of the power source voltage.

6. The electronic circuit according to claim 1, further comprising:
a first power source circuit configured to supply a first voltage as the power source voltage;
a second power source circuit configured to supply a second voltage that is different from the first voltage; and
a power source management unit configured to control the second voltage based on a control amount of the power source voltage controlled by the voltage controller.

7. The electronic circuit according to claim 1, wherein the voltage controller is configured to search a plurality of voltages for such search target voltage that a difference between the delay time and the predetermined desired value is minimum, and to control the power source voltage to be the searched search target voltage.

8. The electronic circuit according to claim 7, wherein the voltage controller is configured to use a linear search algorithm to search for the search target voltage.

9. The electronic circuit according to claim 7, wherein the voltage controller is configured to use a binary search algorithm to search for the search target voltage.

10. A method of controlling an electronic circuit, comprising:
acquiring a delay time based on a value of a delay signal supplied from a plurality of delay elements configured to delay the clock signal by the delay time and to supply the delayed clock signal as the delay signal, the delay time being shorter with a higher power source voltage; and
performing a voltage control process in which the power source voltage is controlled to be high in a case where the acquired delay time is longer than a predetermined desired value and the power source voltage is controlled to be low in a case where the acquired delay time is shorter than the predetermined desired value.

11. An electronic apparatus, comprising:
a plurality of delay elements configured to delay a clock signal by a delay time and to supply the delayed clock signal as a delay signal, the delay time being shorter with a higher power source voltage;
a delay time acquisition unit configured to acquire the delay time based on a value of the delay signal;
a voltage controller configured to perform a voltage control process in which the power source voltage is controlled to be high in a case where the acquired delay time is longer than a predetermined desired value and the power source voltage is controlled to be low in a case where the acquired delay time is shorter than the predetermined desired value; and
a processing circuit configured to perform a predetermined process in synchronization with the clock signal.

* * * * *